(12) United States Patent
Bakowski et al.

(10) Patent No.: US 6,469,359 B2
(45) Date of Patent: Oct. 22, 2002

(54) SEMICONDUCTOR DEVICE AND A METHOD FOR PRODUCTION THEREOF

(75) Inventors: Mietek Bakowski, Södertälje; Ulf Gustafsson, Linköping; Heinz Lendenmann, Stocksund, all of (SE)

(73) Assignee: ABB Reasearch Ltd., Zurich (CH)

( * ) Notice: Subject to any disclaimer, the term of this patent is extended or adjusted under 35 U.S.C. 154(b) by 19 days.

(21) Appl. No.: 09/760,885

(22) Filed: Jan. 17, 2001

(65) Prior Publication Data

US 2002/0094667 A1 Jul. 18, 2002

(51) Int. Cl.⁷ ............................................. H01L 23/58
(52) U.S. Cl. ...................................................... 257/487
(58) Field of Search ........................... 257/76, 77, 487, 257/488, 489, 490, 491, 492, 493, 494, 495

(56) References Cited

U.S. PATENT DOCUMENTS

| | | | |
|---|---|---|---|
| 4,573,066 A | 2/1986 | Whight | 357/52 |
| 5,424,563 A | 6/1995 | Temple et al. | 257/154 |
| 5,932,894 A | 8/1999 | Bakowski et al. | 257/76 |
| 5,994,754 A | * 11/1999 | Hayashi et al. | |
| 6,002,159 A | 12/1999 | Bakowski et al. | 257/493 |

FOREIGN PATENT DOCUMENTS

WO    WO 98/02924    1/1998

OTHER PUBLICATIONS

Theory and Breakdown Voltage for Planar Devices with a Single Field Limiting Ring; Michael S. Adler et al.; published in IEEE Transaction of Electron Devices, vol. ED–24, No. 2, Feb. 1977.; pp. 107–113.

Blocking Capability of Planar Devices with Field Limiting Rings; K.P. Brieger et al.; Solid–State Electronics, vol. 26, No. 8, 1983. pp. 739–745.

Numerical Study of Avalanche Breakdown of 6H–SiC Planar p–n junctions; E. Stefanov et al., published in Diamond and Related Materials, No. 6, 1997; pp. 1500–1503.

Numerical Analysis of Multiple Field Limiting Ring Systems; K. R. Whight et al.; Solid–State Electronics, vol. 27, No. 11, 1984, pp. 1021–1027.

* cited by examiner

Primary Examiner—Keith Christianson
(74) Attorney, Agent, or Firm—Connolly Bove Lodge & Hutz LLP

(57) ABSTRACT

A semiconductor device of planar structure has a pn-junction (10) formed by a first layer (1) doped according to a first conductivity type, n or p, and on top thereof a second layer (2) doped according to a second conductivity type. The second layer has a higher doping concentration than the first layer and a lateral edge thereof is provided with an edge termination with second zones of said second conductivity type separated by first zones (4) of said first conductivity type arranged so that the total charge and/or the effective sheet charge density of dopants according to said second conductivity type is decreasing towards the laterally outer border (8) of the edge termination. A third layer (5) doped according to said first conductivity type is arranged on top of said second layer at least in the region of the edge termination for burying the edge termination of the device thereunder.

28 Claims, 2 Drawing Sheets

SEMICONDUCTOR DEVICE AND A METHOD FOR PRODUCTION THEREOF

The present invention relates to a semiconductor device of planar structure comprising a pn-junction formed by a first layer doped according to a first conductivity type, n or p, and on top thereof a second layer doped according to a second conductivity type opposite to said first conductivity type, said second layer having a higher doping concentration than the first layer and having a lateral edge thereof provided with an edge termination with second zones of said second conductivity type separated by first zones of said first conductivity type arranged so that the total charge and/or the effective sheet charge density of dopants according to said second conductivity type is decreasing towards the laterally outer border of the edge termination, as well as a method for production thereof.

The invention is particularly, but not exclusively, directed to "wide band gap materials", i.e. semiconductor materials having a wide energy gap between the valence band and the conduction band, such as SiC and diamond, since the problems dealt with by the invention are especially accentuated for these materials. Accordingly, the invention and the problems to be solved thereby will hereinafter be discussed for such materials, although it is applicable also to other semiconductor materials.

One of the very favourable properties of SiC is the high breakdown field, which is up to 10 times higher than for silicon, which makes it theoretically possible to construct comparatively thin devices of this material able to hold high voltages in the blocking state thereof resulting in high electric fields at said junction. However a problem to be solved for being able to fully utilize the inherent properties of SiC with respect to the high breakdown field thereof resides in obtaining a proper termination of the voltage absorbing pn-junction at the edge of this junction. The electric field at the periphery of the junction is normally enhanced compared to the electric field in the bulk of the junction. Accordingly, an edge termination is applied for reducing the risk of voltage breakdown or flash-over at the edge of the junction. A termination technique used for reducing the electric field at the pn-junction is to extend the junction by a so-called Junction Termination Extension (JTE) as defined in the introduction. This means that the charge contents of the highly doped side of the junction is gradually decreased towards the edge of the device. This means that in the reverse biased state of the junction the voltage will be distributed over a longer distance in the lateral direction away from the active region of the device towards the edge compared to the vertical direction of the device, and the electric field will thereby be substantially reduced at the edge of the device so formed.

A device according to the introduction is known through WO 98/02924 of the applicant. An advantage of a junction termination of this type is that it is theoretically possible to use the same doping concentrations in all said second zones and still obtain the decrease of the effective sheet charge density of dopants toward the laterally outer border of the edge termination aimed at by using geometrical tricks, such as varying the spacing of adjacent zones. This may then simplify the manufacturing process of the edge termination, since the number of masking steps may be reduced. Although such a device is very favourable it should be possible to improve it in at least some aspects.

SUMMARY OF THE INVENTION

The object of the present invention is to provide a semiconductor device of the type defined in the introduction as well as a method improved in at least some aspects with respect to such devices and methods already known and discussed above.

This object is according to the invention obtained by providing such a device with a third layer doped according to said first conductivity type on top of said second layer at least in the region of said edge termination for burying the edge termination of the device thereunder.

This means that the high electric field regions of the device will be buried into the material and possible peaks of the electric field will be smoothed out through said third layer on top thereof, so that there will be a reduced stress on a surface passivation to be applied on top of the device for insulating it from the environment.

According to a preferred embodiment of the invention said third layer has a substantial thickness for separating said edge termination by a substantial distance to an upper surface of the device, which is favourable for said reduction of stress on the surface passivation.

According to another preferred embodiment of the invention said effective sheet charge density of charge carriers according to said second conductivity type decreases according to a law resulting in a depletion of substantially the entire termination region extending from an active region of said second layer to the lateral edge of the device when a reverse bias of the magnitude for which the device is designed is applied across the pn-junction. This means that the voltage may increase nearly linear in the lateral direction away from said active region of the device resulting in a nearly constant electric field at the surface thereof, since peaks, ripples and the like will be smoothed out by said third layer. Doping of said second zones for obtaining such an electric field being substantially constant in the lateral direction of the device is subject to a further preferred embodiment of the invention.

According to other preferred embodiments of the invention the effective sheet charge density of charge carriers may be decreased by decreasing the area of said second zones forming an interface to said third layer in the lateral direction and/or increasing the lateral distance between said second zones in the lateral direction towards the border of the device.

According to another preferred embodiment of the invention the doping concentration of said second zones are substantially equal. This means that they may theoretically all be created in one single process step, which of course is advantageous from the cost point of view and for the rest also is valid for the embodiment defined in the previous paragraph.

According to another preferred embodiment of the invention said second zones of said second conductivity type are interconnected by a resistive member. This is advantageous for making the voltage gradually increasing in the lateral direction of the device for lowering the electric field at the edge thereof.

According to another preferred embodiment of the invention said second layer is buried also in an active region of the device adjacent to said edge termination. The invention is particularly advantageous for such a device having a buried pn-junction, since it offers the possibility to produce the second layer in said active region and the second zones of said edge termination in the same process step.

According to another preferred embodiment of the invention the device is a device having a buried grid formed by discrete zones of said second layer adjacent to said edge termination zones, so that the grid of the device is continued beyond the active region It will be very simple to obtain the edge termination by simply continue the grid of the device beyond the active region thereof. Such a device having a buried grid may for instance be a JFET or a MOSFET.

According to another preferred embodiment of the invention said first, second and third layers are made of SiC. For the reasons mentioned above, this is particularly advantageous.

A method for producing a device according to the invention involves the creation of all said second zones of said edge termination in one single implantation step for forming such zones with substantially equal doping concentration. This means a possibility of one single masking step for producing all the junction termination zones.

According to one preferred embodiment of the invention said third layer is there when said implantation step is carried out and this is carried out at sufficiently high energy for burying said second zones therein, and according to another embodiment said third layer is not there when said implantation step is carried out, but it is followed by a step of an epitaxial regrowth of material on top of at least the region including the second zones of second conductivity type so created for forming said third layer.

According to another preferred embodiment of the invention the entire second layer and said edge termination zones are created through one and the same implantation step. This will be very advantageous, since the termination will then be created in the same step as the active region part of the pn-junction. Accordingly, no additional process step is required for forming the edge termination of the device.

The invention also comprises a use of a device of this type for switching high powers and/or high voltages and/or high currents, especially in arrangements for protection of equipment for electric power applications. Such a use will be favourable thanks to the improved possibility to utilize inherent high breakdown field properties of the material used for such a device.

Further advantages and advantageous features of the invention appear from the following description and the other dependent claims.

BRIEF DESCRIPTION OF THE DRAWINGS

With reference to the appended drawings, below follows a specific description of preferred embodiments of the invention cited as examples.

In the drawings.

DETAILED DESCRIPTION OF PREFERRED EMBODIMENTS OF THE INVENTION

Figure 1:
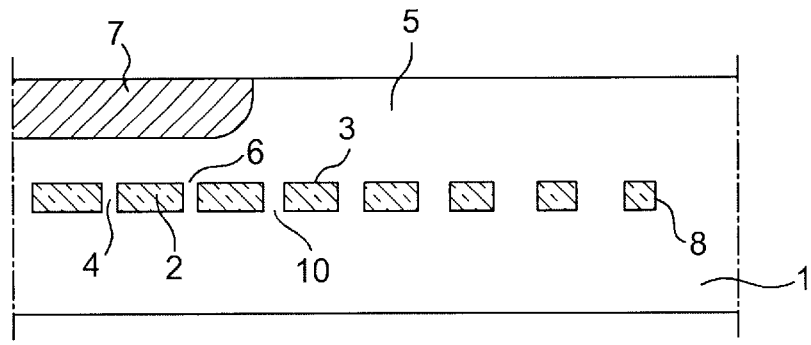
FIG. 1 is a simplified cross-section view of a part of a semiconductor device according to a first preferred embodiment of the invention.

FIG. 1 illustrates a part of a semiconductor device according to a first preferred embodiment of the invention. This device is made of SiC and has a first layer 1 being n-type doped ($10^{13}$–$10^{16}$ cm$^{-3}$), for instance by N or P and a second layer 2 being highly p-type doped ($10^{17}$–$10^{21}$ cm$^{-3}$), for instance by Al or B, on top thereof. This second layer is formed by discrete second zones 3 through implantation of the dopants or epitaxy and etching, which zones when a suitable potential is applied thereto will deplete n-type first zones 4 therebetween for pinching off a conducting part therebetween and forming a pn-junction in the reverse biased state of the device.

The second layer 2 forms a buried grid of the device by an arrangement of an n-type doped third layer 5 on top thereof. It is also illustrated how the device in an active region 6 thereof has a highly n-type doped source region layer 7. Accordingly, this is a Junction Field Effect Transistor (JFET) having a buried grid of a type known within this field. In the on-state of the device a current will flow from the source 7 to a drain not shown located under said first layer 1 through the n-type channels between adjacent zones 3 of the second layer. In the blocking state of the device these channels will be pinched off by applying a suitable potential to the zones of the second layer thus forming a reverse biased pn-junction buried in the device.

Figure 2:
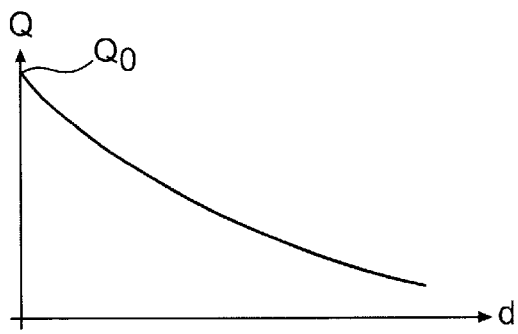
FIG. 2 is a graph of the effective sheet charge density of dopants versus the distance laterally away from the active region of a device according to FIG. 1.

This device further comprises an edge termination according to the present invention. This is formed by continuing the second layer by second zones 3 in the lateral direction away from the active region 6 of the device in such a way that the total charge and/or the effective sheet charge density of dopants of p-type is decreasing towards the laterally outer border 8 of the edge termination. This is in this embodiment obtained by decreasing the area of said second zones 3 forming an interface to said third layer 5 towards the laterally outer border while keeping the doping concentration in each zone substantially equal. Thus, the effective p-dose decreases with the distance from the active area of the device. It is illustrated in FIG. 2 how this effective sheet charge density Q should decrease with a distance d away from the active region of the device for obtaining a substantially linear change of the voltage in the lateral direction of the device resulting in a substantially constant electric field in the direction towards said lateral border. Accordingly, no crowding of equipotential lines close to the active region of the device will occur. $Q_0 \leq 1.1 \times 10^{13}$ cm$^{-2}$ at d=0. (See U.S. patent application No. 08/683,059).

Figure 3:
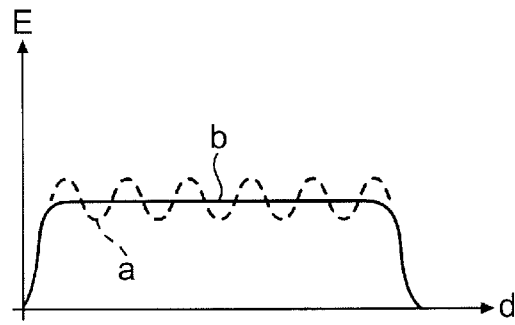
FIG. 3 is a graph of the electric field at the pn-junction of the device according to FIG. 1 when reversed biased and at the surface of the device.

It is illustrated in FIG. 3 how the electric field E is changed over d in the termination region. It is illustrated by a what the electric field would look like if said third layer was not there and by b how the electric field is further smoothed out by the presence of the third layer 5 on top of the termination zones 3. Furthermore, the high electric field region will in this device be buried, which reduces stress on a surface passivation to be applied on top of the third layer 5.

Figure 4:
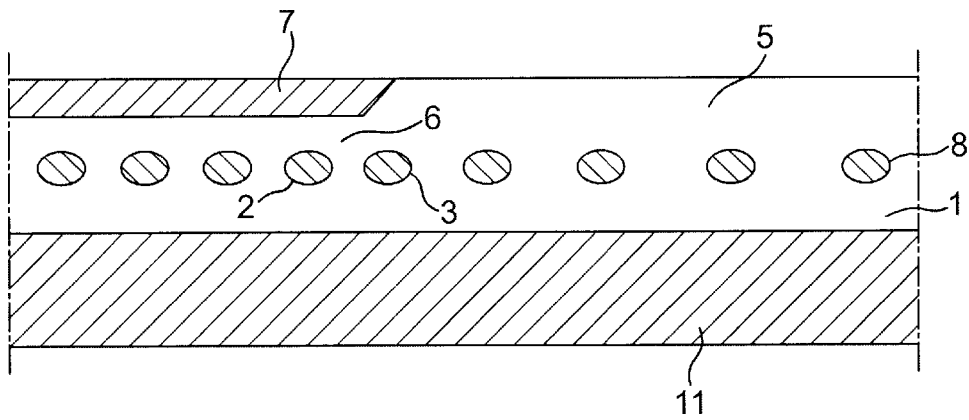
FIG. 4 is a view corresponding to FIG. 1 of a device according to a second preferred embodiment of the invention in the form of a junction field effect transistor with a buried grid.
Figure 5:
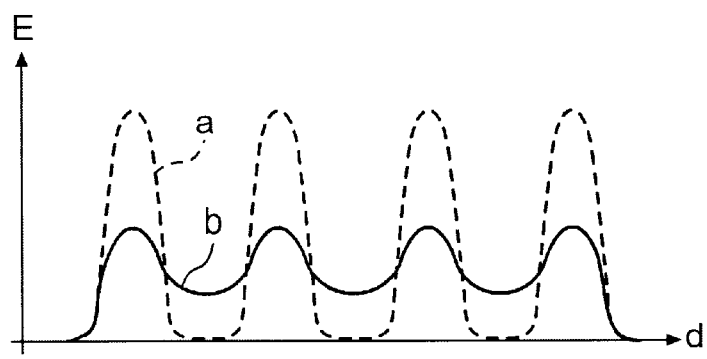
FIG. 5 is a graph corresponding to FIG. 3 for the device according to FIG. 4 when it is reverse biased.

FIG. 4 illustrates a device according to a second preferred embodiment of the invention, and the parts thereof corresponding to parts of the device shown in FIG. 1 are provided with the same reference numerals. The drain 11 of the device has also been shown in this figure. This device differs from the one shown in FIG. 1 by the fact that the second zones of the edge termination have all substantially the same area forming an interface to the third layer 5, but the spacing therebetween increases gradually in the direction towards the lateral outer border 8 of the edge termination. This results in a substantially constant electric field in the lateral direction of the device. However, the zones 3 of the edge termination are here so highly doped that they will not be completely depleted when the device is reverse biased, so that the electric field will in the lateral direction be zero in a part of each zone. The development of the electric field E in this device when reverse biased is schematically illustrated in FIG. 5. a and b correspond to a and b in FIG. 3. The third layer 5 will smooth out this electric field and it may be achieved that the pinch-off potential will increase nearly linearly in the lateral direction for obtaining a substantially constant average surface field. The grid 2 is preferably connected to the source 7, whereas the second zones 3 of the edge termination are interconnected through resistive members not shown for obtaining a voltage drop thereacross.

The devices according to the present invention shown in FIGS. 1 and 4 may be manufactured in a very favourable way. The key issue is the use of termination zones having substantially equal doping concentrations. This means that all the termination zones may be produced in one single step, and it will even be possible to produce them in the same step as the grid in the active region of the device is produced by using the same doping concentration for the termination as for the grid. According to a preferred embodiment of the invention a mask is applied on top of the SiC layer substantially corresponding to said first layer 1 and patterned for exposing the material where the zones for the grid and the termination are to be applied. These zones may then be produced through one single implantation step by for instance shooting A or B atoms with an energy in the order of MeVs into the first layer for forming the zones 3 where the mask is patterned. After removing the mask the third layer 5 may then be epitaxially regrown on top of the first and second layer. Furthermore, an annealing step is also required for making the implanted dopants electrically active.

However, it is pointed out that it would theoretically also be possible to use such a high energy when producing said second zones 3 of the edge termination that they will become buried in the third layer 5 and thus grow the first and third layer before creating the second layer. An advantage of using a regrowth is that the thickness of the third layer 5 may without any problem be optional.

Figure 6:
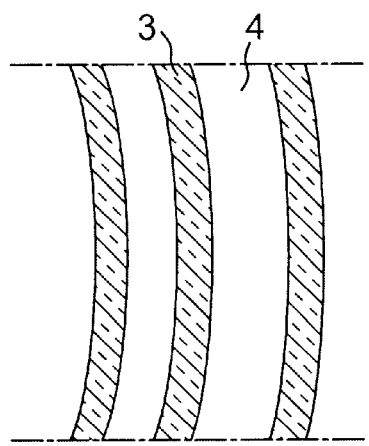
FIGS. 6–8 illustrate different ways according to the invention to obtain a distribution of effective sheet charge density of dopants as illustrated in FIG. 2.
Figure 7:
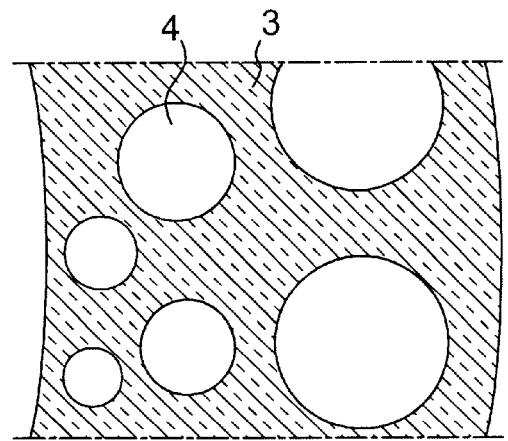
Figure 8:
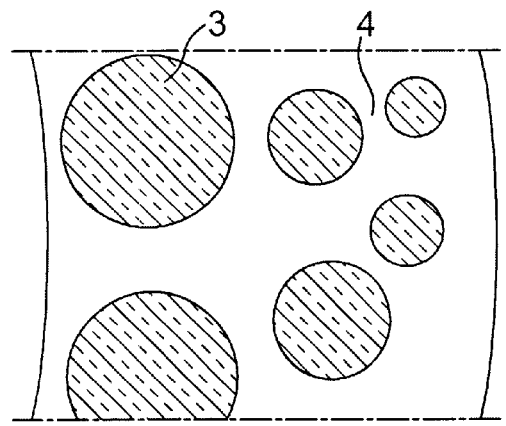

FIGS. 6–8 shows different design rules possible to apply for obtaining the distribution of the effective sheet charge density of charge carriers illustrated in FIG. 2 or to control the pinch-off potential as in FIG. 4 when using the same doping concentration for the termination zones. FIG. 6 illustrates how the second zones 3 are formed by substantially concentric rings with a spacing increasing in the lateral direction of the device. First zones 4 being n-type doped separate the rings.

FIG. 7 illustrates how n-type dot like first zones 4 are arranged with a surface area next to the third layer increasing in the lateral direction d away from the active region of the device. The second zones 3 are here formed by the material between these dots, which results in a gradual decrease of the effective p-dose in the lateral direction d. Accordingly, "second zones of said second conductivity type separated by first zones of said first conductivity type" is here and in the claims to be interpreted as also covering this case in which the different second zones are connected to each other at some locations.

FIG. 8 illustrates another possible embodiment realizing a gradual decrease of the effective sheet charge density of charge carriers in the termination region by arranging said second zones as dots having a total area to the third layer decreasing in the lateral direction towards the outer border 8 of the edge termination.

An alternative is a star-like layout of said zones with increasing spaces between the "beams" and essentially the same increasing distance or decreasing local zone area average as above.

It is evident to a man with skill in the art within this field that other possibilities to obtain the charge distribution according to FIG. 2 or electric field distribution according to FIG. 5 are available.

It is pointed out that in the embodiment according to FIG. 1 one controls the effective sheet charge density of dopants along the surface by controlling the surface coverage of p+ areas, whereas in the embodiment according to FIG. 4 one controls the voltage between the p+ zones by controlling the distance between these zones.

A device of the type described above is well suited for holding high voltages in the blocking state thereof, for example as a switch in connection with transmission or distribution networks for high electric powers.

The invention is of course not in any way restricted to the preferred embodiments described above, but many possibilities to modifications thereof would be apparent to a man with ordinary skill in the art without departing from the basic idea of the invention as defined in the appended claims.

The device according to the invention may be of any type having a pn-junction adapted to hold a voltage in the blocking state of the device, such as for example diodes, a MOSFET with buried grid as described in the Swedish patent application No. 9704149-5 of the applicant etc.

The conductivity type of the different layers may be of the opposite type to the one mentioned above, so that the second layer may be n-type doped.

It is also possible to have only the junction termination buried, whereas the second layer is in the active region of the device not buried.

What is claimed is:

1. A semiconductor device of planar structure comprising a pn-junction (10) formed by a first layer (1) doped according to a first conductivity type, n or p, and on top thereof a second layer (2) doped according to a second conductivity type opposite to said first conductivity type, said second layer having a higher doping concentration than the first layer and having a lateral edge thereof provided with an edge termination with second zones (3) of said second conductivity type separated by first zones (4) of said first conductivity type arranged so that the total charge and/or the effective sheet charge density of dopants according to said second conductivity type is decreasing towards the laterally outer border (8) of the edge termination, characterized in that a third layer (5) doped according to said first conductivity type is arranged on top of said second layer at least in the region of said edge termination for burying the edge termination of the device thereunder.

2. A device according to claim 1, characterized in that said third layer (5) has a substantial thickness for separating said edge termination by a substantial distance to an upper surface of the device.

3. A device according to claim 1, characterized in that said effective sheet charge density of charge carriers according to said second conductivity type decreases resulting in a depletion of substantially the entire termination region extending from an active region (6) of said second layer (2) to the lateral edge of the device when a reverse bias of the magnitude for which the device is designed is applied across the pn-junction.

4. A device according to claim 3, characterized in that the effective sheet charge density of charge carriers according to said conductivity type decreases towards the laterally outer border (8) of the edge termination according to a law making the electric field substantially constant in the lateral direction towards said border.

5. A device according to claim 1, characterized in that said effective sheet charge density of charge carriers decreases towards the laterally outer border (8) of the edge termination by a decrease of the area of said second zones (3) forming an interface to said third layer (5) towards said laterally outer border.

6. A device according to claim 1, characterized in that said effective sheet charge density of charge carriers according to said second conductivity type decreases towards the laterally outer border (8) of the edge termination through an increase of a lateral distance between said second zones (3) in the lateral direction towards said border.

7. A device according to claim 1, characterized in that said second zones (3) have substantially the same area forming an interface to said third layer (5).

8. A device according to claim 1, characterized in that the doping concentration of said second zones (3) are substantially equal.

9. A device according to claim 1, characterized in that said second zones (3) are island-like.

10. A device according to claim 1, characterized in that said first zones (4) of said first conductivity type are island-like and the second zones (3) of said second conductivity type are formed by the material surrounding said islands.

11. A device according to claim 1, characterized in that said second zones (3) of said second conductivity type are interconnected by a resistive member.

12. A device according to claim 1, characterized in that said second layer (2) is buried also in an active region (6) of the device adjacent to said edge termination.

13. A device according to claim 1, characterized in that said second layer (2) is not buried in an active region thereof adjacent to said edge termination.

14. A device according to claim 1, characterized in that said second layer (2) is in an active region (6) thereof adjacent to said edge termination formed by laterally spaced discrete second zones (3) too.

15. A device according to claim 1, characterized in that an active region (6) of said second layer (2) adjacent to said edge termination is connected to said edge termination so that this at this connection has substantially the same potential as the second layer in the active region.

16. A device according to claim 1, characterized in that it is a junction field effect transistor (JFET) with a buried grid formed by discrete zones (3) of said second layer adjacent to said edge termination zones, so that the grid of the device is continued beyond the active region (6).

17. A device according to claim 1, characterized in that it is a MOSFET-transistor with a buried grid formed by discrete zones (3) of said second layer adjacent to said edge termination zones, so that the grid of the device is continued beyond the active region (6).

18. A device according to claim 1, characterized in that it is a diode.

19. A device according to claim 1, characterized in that said first, second and third layers are made of a semiconductor material having a wide energy gap between the valence band and the conduction band, i.e. exceeding 1,5 eV.

20. A device according to claim 19, characterized in that said material is SiC.

21. A device according to claim 1, characterized in that said second conductivity type is p.

22. A device according to claim 1, characterized in that it is designed to be able to hold high voltages when reverse biased, advantageously exceeding 1 kV and preferably exceeding 10 kV.

23. A use of a device according to claim 1 for switching high powers and/or high voltages and/or high currents.

24. A use according to claim 23 in arrangements for protection of equipment for electric power applications.

25. A method for producing a device according to claim 1, characterized in that all said second zones (3) of said edge termination are created in one single implantation step for forming such zones with substantially equal doping concentration.

26. A method according to claim 25, characterized in that the entire second layer (2) and said edge termination zones (3) are created through one and the same implantation step.

27. A method according to claim 25, characterized in that said third layer (5) is there when said implantation step is carried out and that this is carried out at sufficiently high energies for burying said second zones (3) therein.

28. A method according to claim 25, characterized in that the implantation step is followed by a step of an epitaxial regrowth of material on top of at least the region including the second zones of second conductivity type so created for forming said third layer (5).

* * * * *